(12) United States Patent
Iwamoto et al.

(10) Patent No.: US 12,119,433 B2
(45) Date of Patent: *Oct. 15, 2024

(54) METHOD OF MANUFACTURING LIGHT EMITTING DEVICE AND METHOD OF MANUFACTURING LIGHT EMITTING MODULE

(71) Applicant: Nichia Corporation, Anan (JP)

(72) Inventors: Kazuyo Iwamoto, Tokushima (JP); Masaya Miyazaki, Tokushima (JP)

(73) Assignee: Nichia Corporation, Anan (JP)

( * ) Notice: Subject to any disclaimer, the term of this patent is extended or adjusted under 35 U.S.C. 154(b) by 412 days.

This patent is subject to a terminal disclaimer.

(21) Appl. No.: 17/544,129

(22) Filed: Dec. 7, 2021

(65) Prior Publication Data
US 2022/0190214 A1  Jun. 16, 2022

(30) Foreign Application Priority Data

Dec. 14, 2020 (JP) ................................. 2020-206838
Mar. 23, 2021 (JP) ................................. 2021-048016
Jul. 2, 2021 (JP) ................................. 2021-110531

(51) Int. Cl.
*H01L 33/56* (2010.01)
*H01L 33/00* (2010.01)
(Continued)

(52) U.S. Cl.
CPC ............ *H01L 33/56* (2013.01); *H01L 33/005* (2013.01); *H01L 33/10* (2013.01); *H01L 33/382* (2013.01);
(Continued)

(58) Field of Classification Search
CPC ....... H01L 33/56; H01L 33/005; H01L 33/10; H01L 33/382; H01L 33/52
See application file for complete search history.

(56) References Cited

U.S. PATENT DOCUMENTS

2003/0227095 A1  12/2003  Fujisawa et al.
2005/0067717 A1   3/2005  Shizuno
(Continued)

FOREIGN PATENT DOCUMENTS

CN  114093902 A  2/2022
JP  H01-134938 A  5/1989
(Continued)

*Primary Examiner* — Samuel A Gebremariam
(74) *Attorney, Agent, or Firm* — Foley & Lardner LLP

(57) ABSTRACT

A method of manufacturing a light emitting device includes: providing a light emitting element comprising: a semiconductor laminate having a first surface, a second surface, and a lateral surface between the first and second surfaces, and an electrode disposed at the second surface; disposing a resin layer in an A-stage state on a support; placing the light emitting element on an upper surface of the resin layer while the upper surface of the resin layer and the first surface of the semiconductor laminate face each other; heating the resin layer at a first temperature to reduce a viscosity of the resin layer and causing the light emitting element to sink due to its own weight such that the second surface of the semiconductor laminate is exposed; and curing the resin layer by heating the resin layer at a second temperature higher than the first temperature, thereby forming a resin member.

12 Claims, 8 Drawing Sheets

(51) Int. Cl.
*H01L 33/10* (2010.01)
*H01L 33/38* (2010.01)

(52) U.S. Cl.
CPC ............... *H01L 2933/0016* (2013.01); *H01L 2933/005* (2013.01)

(56) References Cited

U.S. PATENT DOCUMENTS

| | | |
|---|---|---|
| 2006/0008944 A1 | 1/2006 | Shizuno |
| 2006/0275952 A1 | 12/2006 | Gowda et al. |
| 2013/0157419 A1 | 6/2013 | Shimizu et al. |
| 2014/0024153 A1 | 1/2014 | Mitani et al. |
| 2014/0024179 A1 | 1/2014 | Mitani et al. |
| 2014/0091348 A1 | 4/2014 | Katayama et al. |
| 2014/0220714 A1 | 8/2014 | Sorimachi |
| 2015/0179482 A1 | 6/2015 | Mitani et al. |
| 2015/0194324 A1 | 7/2015 | Mitani et al. |
| 2018/0239193 A1 | 8/2018 | Hayashi |
| 2018/0287020 A1 | 10/2018 | Kim et al. |
| 2021/0080786 A1 | 3/2021 | Hayashi |
| 2022/0069177 A1 | 3/2022 | Yamada et al. |
| 2023/0037204 A1* | 2/2023 | Mitsuhashi ......... H01L 25/0753 |

FOREIGN PATENT DOCUMENTS

| | | |
|---|---|---|
| JP | 2001-028376 A | 1/2001 |
| JP | 2004-152983 A | 5/2004 |
| JP | 2004-288771 A | 10/2004 |
| JP | 2005-108898 A | 4/2005 |
| JP | 2008-060608 A | 3/2008 |
| JP | 2008-543109 A | 11/2008 |
| JP | 2012-169501 A | 9/2012 |
| JP | 2013-128060 A | 6/2013 |
| JP | 2014-075450 A | 4/2014 |
| JP | 2015-213201 A | 11/2015 |
| JP | 2016-076694 A | 5/2016 |
| JP | 2017-228657 A | 12/2017 |
| JP | 2018-133304 A | 8/2018 |
| WO | WO-2013/005646 A1 | 1/2013 |
| WO | WO-2014/014008 A1 | 1/2014 |

\* cited by examiner

[FIG. 1A]
[FIG. 1B]
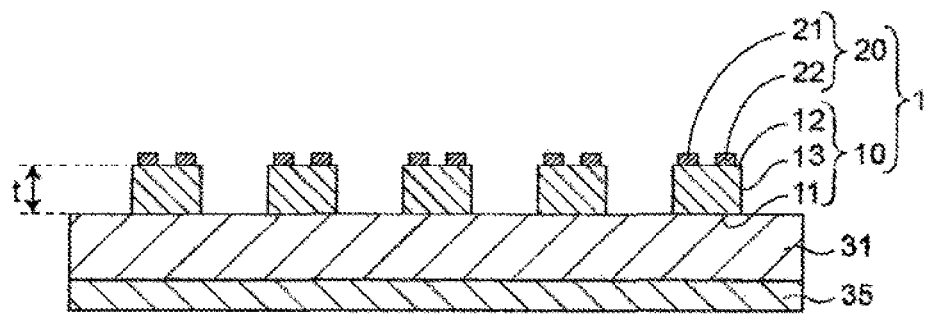
[FIG. 1C]
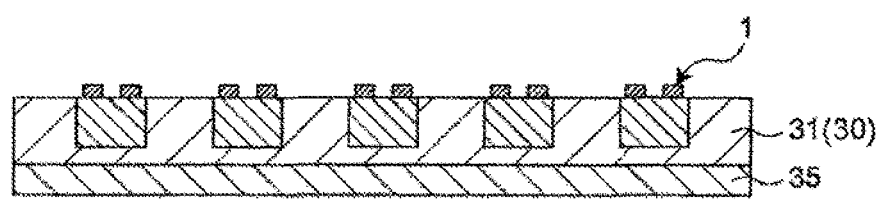

[FIG. 1D]
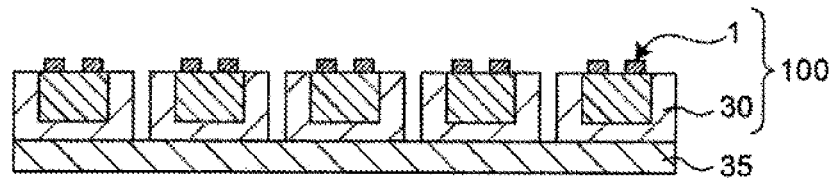
[FIG. 1E]
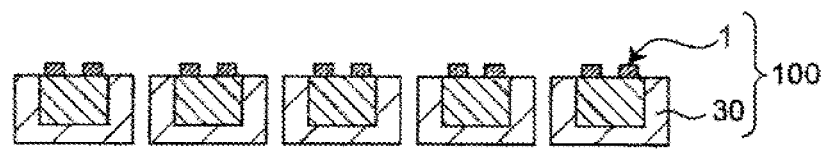
[FIG. 1F]
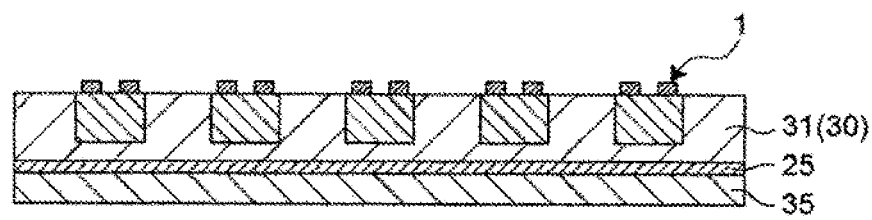
[FIG. 1G]
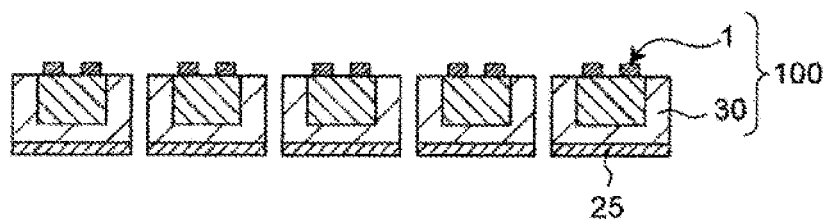

[FIG. 1H]
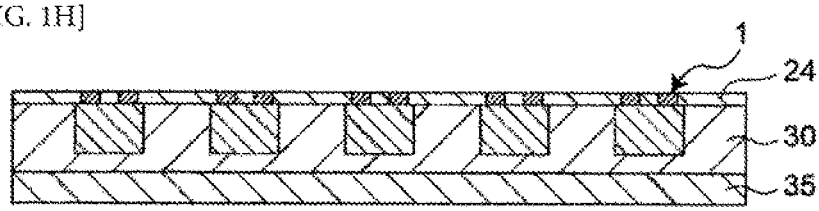
[FIG. 1I]
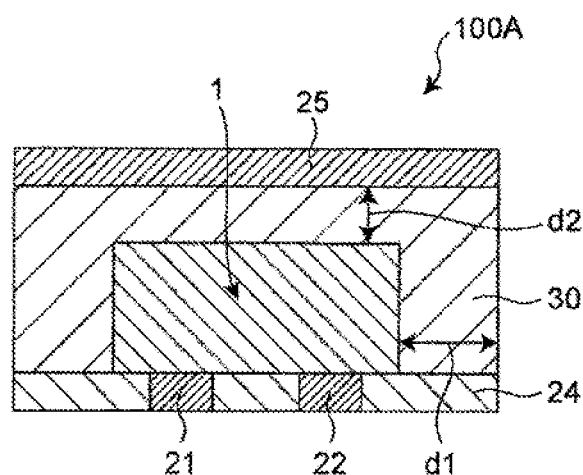
[FIG. 2A]
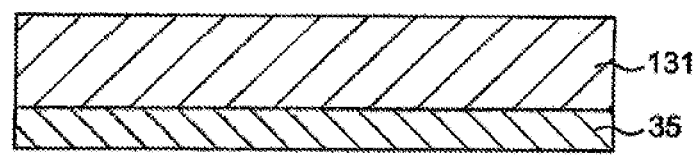

[FIG. 2B]
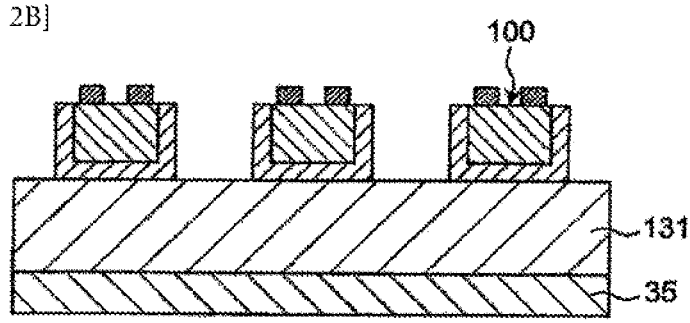
[FIG. 2C]
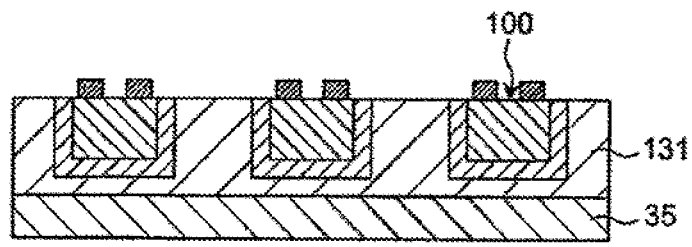
[FIG. 2D]
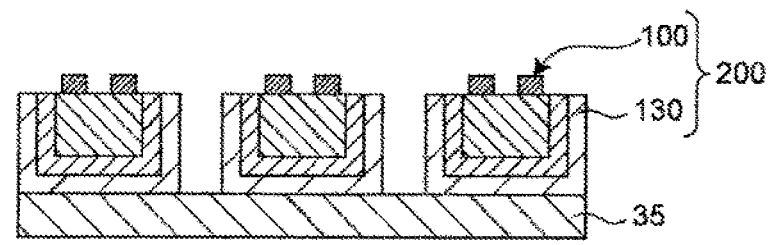
[FIG. 2E]
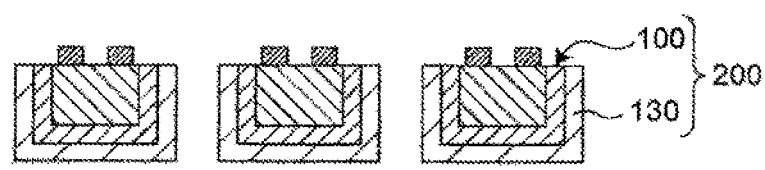

[FIG. 3A]
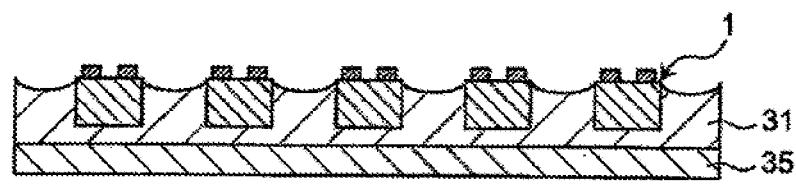
[FIG. 3B]
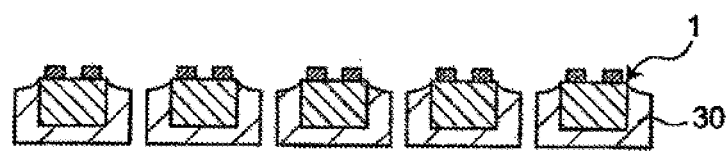
[FIG. 4A]
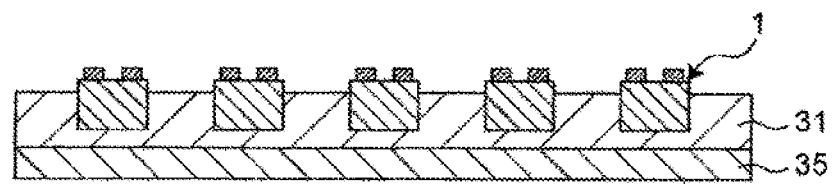
[FIG. 4B]
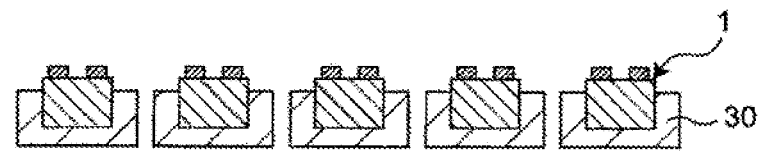

[FIG. 5A]
[FIG. 5B]
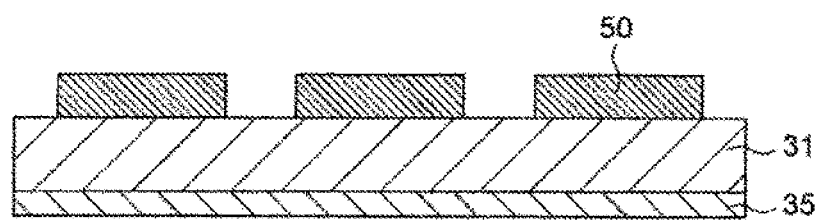
[FIG. 5C]
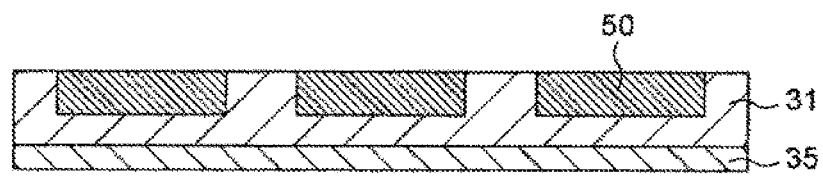
[FIG. 5D]
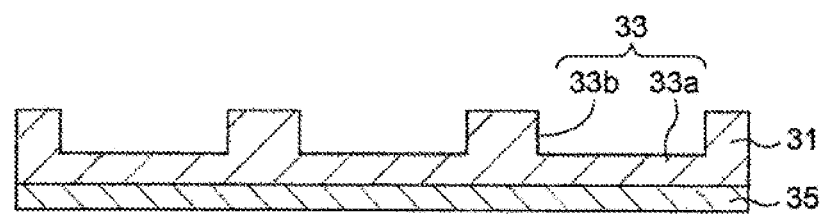

[FIG. 5E]
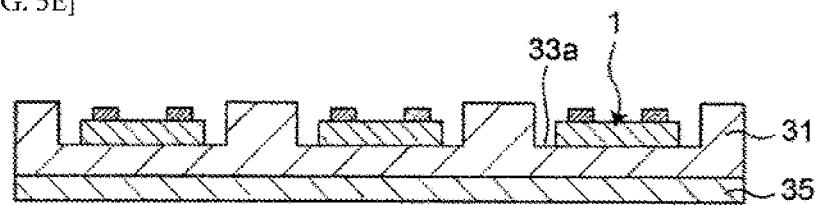
[FIG. 5F]
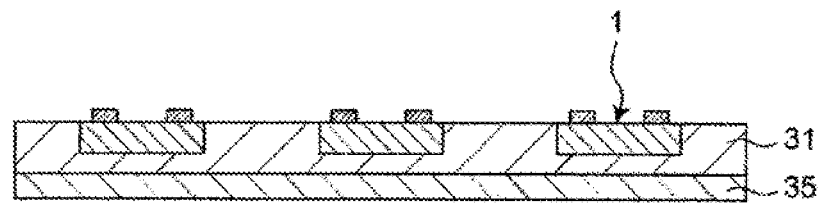
[FIG. 6]
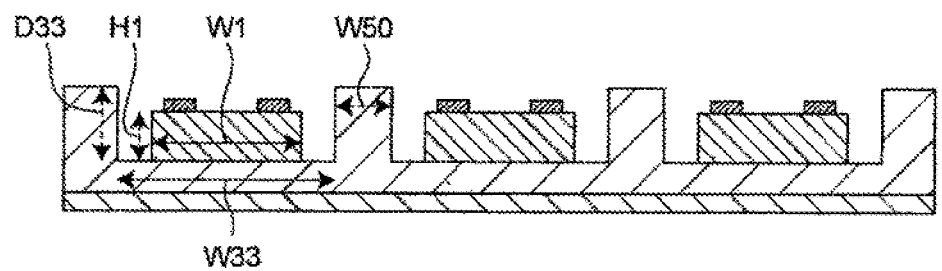

[FIG. 7A]
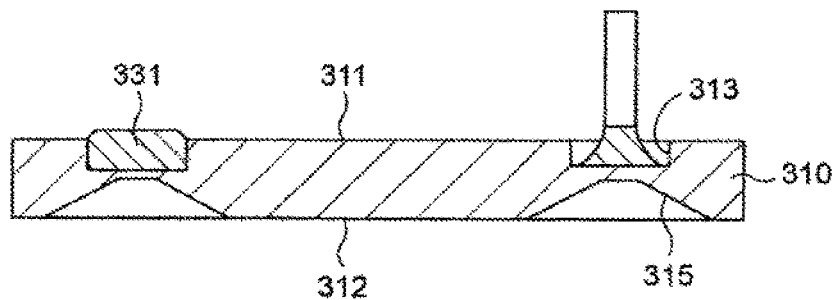
[FIG. 7B]
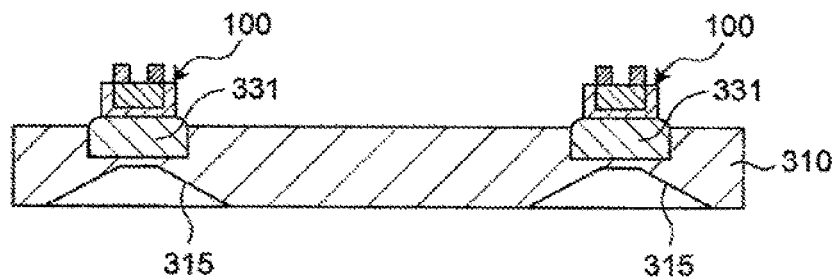
[FIG. 7C]
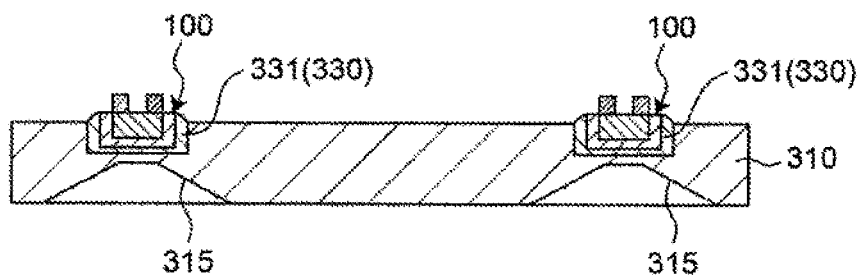

METHOD OF MANUFACTURING LIGHT EMITTING DEVICE AND METHOD OF MANUFACTURING LIGHT EMITTING MODULE

CROSS-REFERENCE TO RELATED APPLICATION

This application claims priority to Japanese Patent Application No. 2020-206838, filed on Dec. 14, 2020, Japanese Patent Application No. 2021-048016, filed on Mar. 23, 2021, and Japanese Patent Application No. 2021-110531, filed on Jul. 2, 2021, the disclosures of which are hereby incorporated by reference in their entireties.

BACKGROUND

The present disclosure relates to a method of manufacturing a light emitting device and a method of manufacturing a light emitting module.

Light emitting devices and light emitting modules, which include light emitting elements, are known (see, for example, JP 2017-228657 A and JP 2018-133304 A).

As the applications of light emitting devices and modules that comprise a light emitting element is expanding, there is an increasing demand for inexpensive light emitting devices and light emitting modules.

SUMMARY

It is an object of the present disclosure to provide a method of manufacturing a light emitting device and a method of manufacturing a light emitting module that allow for manufacturing the light emitting device and the light emitting module, respectively, at low cost.

According to one embodiment, a method is provided for manufacturing a light emitting device comprising a light emitting element that comprises: a semiconductor laminate having a first surface, a second surface opposite to the first surface, and a lateral surface between the first surface and the second surface, wherein the lateral surface is covered with a resin member, and an electrode disposed at the second surface of the semiconductor laminate. The method comprises: disposing a resin layer in an A-stage state on a support; placing the light emitting element on an upper surface of the resin layer while the upper surface of the resin layer and the first surface of the semiconductor laminate face each other; heating the resin layer at a first temperature to reduce a viscosity of the resin layer and causing the light emitting element to sink due to an own weight of the light emitting element such that the second surface of the semiconductor laminate is exposed; and curing the resin layer, with the second surface exposed, by heating the resin layer at a second temperature higher than the first temperature to form the resin member.

According to another embodiment, a method of manufacturing a light emitting module comprises: preparing a light source comprising a semiconductor laminate having a first surface, a second surface opposite to the first surface, and a lateral surface between the first surface and the second surface, and an electrode disposed at the second surface of the semiconductor laminate, wherein at least the second surface of the semiconductor laminate is exposed to an outside; preparing a light guide plate having a first main surface and a second main surface opposite to the first main surface, and having a recess in the first main surface; disposing a resin layer in an A-stage state inside the recess; placing the light source on an upper surface of the resin layer while the upper surface of the resin layer and the first surface of the light emitting element face each other; heating the resin layer at a first temperature to reduce a viscosity of the resin layer and causing the light source to sink due to an own weight of the light source such that the second surface of the semiconductor laminate is exposed; and curing the resin layer, with the second surface exposed, by heating the resin layer at a second temperature higher than the first temperature to form the resin member.

The above-described methods make it possible to manufacture the light emitting device and the light emitting module at low cost.

BRIEF DESCRIPTION OF THE DRAWINGS

FIG. 1A is a schematic cross-sectional view showing an example of a manufacturing step of a light emitting device according to a first embodiment.

FIG. 1B is a schematic cross-sectional view showing an example of a manufacturing step of the light emitting device according to the first embodiment.

FIG. 1C is a schematic cross-sectional view showing an example of a manufacturing step of the light emitting device according to the first embodiment.

FIG. 1D is a schematic cross-sectional view showing an example of a manufacturing step of the light emitting device according to the first embodiment.

FIG. 1E is a schematic cross-sectional view showing an example of a light emitting device 100 obtained by a method of manufacturing a light emitting device according to the first embodiment.

FIG. 1F is a schematic cross-sectional view showing an example of a manufacturing step of a light emitting device according to modification 3 of the first embodiment.

FIG. 1G is a schematic cross-sectional view showing an example of a method of manufacturing a light emitting device according to modification 3 of the first embodiment.

FIG. 1H is a schematic cross-sectional view showing an example of a manufacturing step of a light emitting device according to modification 4 of the first embodiment.

FIG. 1I is a schematic cross-sectional view showing an example of a light emitting device obtained by a method of manufacturing a light emitting device according to modification 5 of the first embodiment.

FIG. 2A is a schematic cross-sectional view showing an example of a manufacturing step of a light emitting device according to a second embodiment.

FIG. 2B is a schematic cross-sectional view showing an example of a manufacturing step of the light emitting device according to the second embodiment.

FIG. 2C is a schematic cross-sectional view showing an example of a manufacturing step of the light emitting device according to the second embodiment.

FIG. 2D is a schematic cross-sectional view showing an example of a manufacturing step of the light emitting device according to the second embodiment.

FIG. 2E is a schematic cross-sectional view showing an example of a light emitting device 200 obtained by a method of manufacturing a light emitting device according to the second embodiment.

FIG. 3A is a schematic cross-sectional view showing an example of a manufacturing step of a light emitting device according to a modification of the first embodiment.

FIG. 3B is a schematic cross-sectional view showing an example of the light emitting device obtained by a method of manufacturing a light emitting device according to the modification of the first embodiment.

FIG. 4A is a schematic cross-sectional view showing an example of a manufacturing step of a light emitting device according to another modification of the first embodiment.

FIG. 4B is a schematic cross-sectional view showing an example of a light emitting device obtained by a method of manufacturing a light emitting device according to the other modification of the first embodiment.

FIG. 5A is a schematic cross-sectional view showing an example of a manufacturing step of a light emitting module according to a third embodiment.

FIG. 5B is a schematic cross-sectional view showing an example of a manufacturing step of the light emitting module according to the third embodiment.

FIG. 5C is a schematic cross-sectional view showing an example of a manufacturing step of the light emitting module according to the third embodiment.

FIG. 5D is a schematic cross-sectional view showing an example of a manufacturing step of the light emitting module according to the third embodiment.

FIG. 5E is a schematic cross-sectional view showing an example of a manufacturing step of the light emitting module according to the third embodiment.

FIG. 5F is a schematic cross-sectional view showing an example of a manufacturing step of the light emitting module according to the third embodiment.

FIG. 6 is a schematic cross-sectional view showing width W1 and height H1 of the light emitting element, depth D33 and width W33 of a concave portion 33, and width W50 of a wall between adjacent concave portions 33, in correspondence with FIG. 5E.

FIG. 7A is a schematic cross-sectional view showing an example of a manufacturing step of a light emitting module according to a fourth embodiment.

FIG. 7B is a schematic cross-sectional view showing an example of a manufacturing step of the light emitting module according to the fourth embodiment.

FIG. 7C is a schematic cross-sectional view showing an example of a manufacturing step of the light emitting module according to the fourth embodiment.

DETAILED DESCRIPTION

Hereinafter, embodiments for carrying out the invention according to the present disclosure will be described with reference to the accompanying drawings.

It is noted that a method of manufacturing a light emitting device and a method of manufacturing a light emitting module described below are for embodying the technical idea of the invention according to the present disclosure, and the invention according to the present disclosure is not limited to the following, unless otherwise specifically stated. Throughout the respective drawings, members having the same function may be denoted by the same sign. For the sake of convenience and ease of explanation or understanding of the main points, the description below may be separately made for each embodiment, but the configurations of different embodiments could be partially substituted or combined. The descriptions about matters common to the foregoing will be omitted in the subsequent embodiments, and thus only differences therebetween will be explained. In particular, similar configurations with similar functions and effects will not be described again in each embodiment. The size, positional relationship, etc., of members shown in each drawing may be exaggerated for clarity of the explanation. In some cases, an end view showing only the cut surface is used as a cross-sectional view.

First Embodiment

A method of manufacturing a light emitting device according to a first embodiment of the present disclosure is a method of manufactures a light emitting device 100 comprising (i) a light emitting element 1 comprising a semiconductor laminate 10 having a first surface 11, which is, for example, a light emitting surface, a second surface 12 located opposite to the first surface 11, and lateral surfaces 13 between the first surface 11 and the second surface 12, and an electrode 20 comprising a first electrode 21 and a second electrode 22 that are disposed on the second surface 12 of the semiconductor laminate 10; and (ii) a resin member 30 covering at least the lateral surfaces 13 of the semiconductor laminate 10.

The method of manufacturing a light emitting device according to the first embodiment of the present disclosure comprises:

(a) disposing a resin layer 31 in an A-stage state on a support 35;

(b) placing the light emitting element 1 on an upper surface of the resin layer 31 in the A-stage state disposed on the support 35 while the upper surface of the resin layer 31 and the first surface 11 of the light emitting element 1 face each other;

(c) heating the resin layer 31 at a first temperature to reduce a viscosity of the resin layer 31, and causing the light emitting element 1 to sink due to the own weight of the light emitting element 1 such that the second surface 12 of the semiconductor laminate 10 is exposed from the resin layer 31; and (d) curing the resin layer 31, with the second surface 12 exposed from the resin layer 31, by heating the resin layer 31 at a second temperature higher than the first temperature to form the resin member 30.

Hereinafter, each step will be described in detail.

(a) Step of Disposing Resin Layer 31

Here, the resin layer 31 in the A-stage state is disposed on the support 35 as shown in FIG. 1A by attaching a resin sheet in the A-stage state prepared in advance onto the support 35. The attachment of the resin sheet can be performed using, for example, a vacuum laminator. Specifically, the resin sheet is pressed against the support by a diaphragm while reducing the pressure to a predetermined vacuum level. The way to dispose the resin layer 31 in this step is not limited to the attachment of the resin sheet. For example, the resin layer 31 in the A-stage state may be disposed by applying resin in an uncured state onto the support 35. Here, the A-stage state means an uncured state. The viscosity or the like of the resin layer 31 in the A-stage state, specifically, in the uncured state, is adjusted such that the light emitting element 1 sinks due to its own weight such that the second surface 12 of the semiconductor laminate 10 is exposed, based on the specific gravity of the resin layer 31 and the own weight of the light emitting element 1. Furthermore, the A-stage state is not in liquid form, but is a state having no fluidity. For example, a liquid resin material containing a solvent such as cyclohexane is applied onto the support, and then most of the solvent is volatilized, whereby the resin material remains on the support while not flowing thereon. This state is referred to as the A-stage or uncured state.

Examples of the resin used to constitute the resin layer 31 include thermosetting resins such as a silicone resin, an epoxy resin, and an acrylic resin. For example, roll coating, spraying, compression molding, etc., can be used as a method of disposing the resin layer 31. A thickness of the resin layer 31 is preferably greater than a thickness t (the distance between the first surface 11 and the second surface 12) of the semiconductor laminate 10 of the light emitting element 1. Alternatively, the thickness of the resin layer 31 may be less than the thickness t of the semiconductor laminate 10 of the light emitting element 1. When the thickness of the resin layer 31 is less than the thickness t of the semiconductor laminate 10 of the light emitting element 1, in the step of causing the light emitting element 1 to sink as described below, the light emitting element 1 can be disposed such that the lateral surfaces 13 of the semiconductor laminate 10 of the light emitting element 1 are entirely covered with the resin layer 31 by using the wetting-up of the resin onto the lateral surfaces 13.

(b) Step of Placing Light Emitting Element 1

Here, in a state in which the resin layer 31 is disposed on the support 35 remains in the A-stage state, the light emitting element 1 is placed on the upper surface of the resin layer 31 while the upper surface of the resin layer 31 and the first surface 11 of the light emitting element 1 face each other as shown in FIG. 1B. The light emitting element 1 is placed apart from each other at predetermined intervals, depending on the size of the targeted light emitting device 100. Specifically, the light emitting element 1 is disposed at predetermined intervals, for example, in a matrix, in consideration of the thickness of the resin member 30 covering the lateral surfaces 13 of the semiconductor laminates 10 of the light emitting elements 1.

The method of placing the light emitting element 1 on the upper surface of the resin layer 31 is not particularly limited, and the light emitting element 1 may be placed one by one in sequence, or a plurality of light emitting elements 1 may be placed collectively.

For example, in the case of placing a plurality of light emitting elements 1 collectively, these light emitting elements are prepared in such a manner that they are disposed via a photosensitive adhesive on a support (hereinafter referred to as a second support) which is different from the support on which the above-described resin layer 31 is disposed. Then, the adhesive is irradiated with laser light from the second support side, and thereby the plurality of light emitting elements is peeled off from the second support. Thus, the light emitting elements 1 can be collectively transferred and placed onto the upper surface of the resin layer 31.

The semiconductor laminate 10 of the light emitting element 1 comprises, for example, a substrate made of sapphire, gallium nitride, etc., an n-type semiconductor layer and a p-type semiconductor layer which are disposed over the substrate, and a light emitting layer sandwiched between these semiconductor layers. The light emitting element 1 further comprises the first electrode electrically connected to the n-type semiconductor layer and the second electrode electrically connected to the p-type semiconductor layer. The semiconductor laminate 10 does not need to have the substrate. The structure of the light emitting layer can be a structure with a single active layer such as a double heterostructure or a single quantum well (SQW) structure, or a structure with a group of active layers such as a multiple quantum well (MQW) structure. The light emitting layer is capable of emitting visible light or ultraviolet light. The light emitting layer is capable of emitting visible light ranging from blue to red. The semiconductor laminate 10 with such a light emitting layer can contain, for example, $In_xAl_yGa_{1-x-y}N$ ($0 \leq x$, $0 \leq y$, $x+y \leq 1$). The semiconductor laminate 10 can include at least one light emitting layer that is capable of emitting the light as described above. For example, the semiconductor laminate 10 can have a structure including one or more light emitting layers between the n-type semiconductor layer and the p-type semiconductor layer, or a structure obtained by repeating the arrangement, including the n-type semiconductor layer, the light emitting layer, and the p-type semiconductor layer in that order, multiple times. When the semiconductor laminate 10 includes a plurality of light emitting layers, it may include light emitting layers with different emission peak wavelengths or the same emission peak wavelength. It is noted that the same emission peak wavelength described above may allow for variations of about a few nanometers. The combination of the emission peak wavelengths can be selected as appropriate. For example, when the semiconductor laminate 10 has two light emitting layers, these two light emitting layers can be selected to emit light of a combination of colors, such as blue and blue, green and green, red and red, ultraviolet and ultraviolet, blue and green, blue and red, or green and red. The light emitting layer may include a plurality of active layers with different emission peak wavelengths or with the same emission peak wavelength.

(c) Step of Causing Light Emitting Element 1 to Sink

Here, the resin layer 31 is heated at the first temperature to reduce the viscosity of the resin layer 31. This causes the light emitting element 1 to sink due to its own weight such that the second surface 12 of the semiconductor laminate 10 is exposed from the upper surface of the resin layer 31.

The first temperature at which the resin layer 31 is heated is set as appropriate such that the viscosity of the resin material constituting the resin layer 31 in the A-stage state is reduced so that the second surface 12 of the semiconductor laminate 10 is exposed and the resin of the resin layer 31 contacts with the entire lateral surfaces 13 of the semiconductor laminate 10 as shown in FIG. 1C. For example, the first temperature is set to the temperature at which the desired sinking state is achieved, by referring to a database; this database stores sinking states of the light emitting element demonstrated when changing the temperature of heating of the resin layer, depending on the type of resin material that constitutes the resin layer and its viscosity in the A-stage state as well as the shape and weight of the light emitting element.

Here, the sinking state of the light emitting element means the positional relationship or the like between the upper surface of the resin layer located between the light emitting elements, and an electrode formation surface of the light emitting element. In other words, the database for reference stores, for example, the temperature at which the upper surface of the resin layer between the light emitting elements placed adjacent to each other is located substantially on the same plane as the electrode formation surfaces of the light emitting elements, the temperature at which the upper surface of the resin layer between the light emitting elements is located below the plane including the electrode formation surfaces of the light emitting elements, the temperature at which the upper surface of the resin layer between the light emitting elements is located above the plane including the electrode formation surfaces of the light emitting elements, and the like. The first temperature is selected as appropriate based on the information stored in the database in consideration of the final shape of a light emitting device to be manufactured. For example, for the resin layer 31 containing thermosetting silicone, epoxy, or acrylic resin, the first temperature is in the range of 70° C. to 100° C. The heating time can be 10 minutes or more, for example.

The first temperature is not necessarily maintained at a specific temperature for a predetermined period of time, and may be increased continuously. In other words, the temperature range from the temperature at which the temperature rise for heating the resin material is started to the temperature at which it is terminated (e.g., the second temperature) only needs to include the temperature range in which the light emitting element can be caused to sink in the resin layer in the A-stage state, thereby achieving the target sinking state. For example, in a case where the second temperature described below is set at 150° C., the temperature rise is preferably carried out from about 60° C. to 150° C., for example, over about one hour, and particularly it is preferable to gradually carry out the temperature rise from 70° C. to 100° C. including the first temperature.

(d) Step of Forming Resin Member 30 by Curing Resin Layer 31

Here, the resin layer 31 is cured, with the second surface 12 exposed, by heating the resin layer 31 at the second temperature higher than the first temperature. In this way, the resin member 30 is formed.

The second temperature for curing the resin layer 31 is set as appropriate based on the curing temperature of the resin material that constitutes the resin layer 31. For example, for the resin layer 31 containing thermosetting silicone, epoxy, or acrylic resin, the second temperature is in the range of 150° C. to 200° C. The heating time can be, for example, 1 hour or more and 8 hours or less.

The temperature rise from the first temperature in the step of causing the light emitting element 1 to sink to the second temperature in this step may be carried out by continuously increasing the temperature from the first temperature to the second temperature without lowering the temperature from the first temperature. Alternatively, this temperature rise may be carried out by temporarily lowering the temperature from the first temperature, for example, decreasing the temperature to the room temperature (20±5° C.) and then increasing the temperature to the second temperature. Such a temperature rise can be set as appropriate in consideration of the efficiency of the manufacturing process and the like.

After curing the resin layer 31, as shown in FIG. 1D, the resin member 30 is cut between adjacent light emitting elements 1. The lateral surfaces 13 of each light emitting element 1 are covered with the resin member 30 of a predetermined thickness in the direction along which the light emitting elements 1 are adjacent.

Then, as shown in FIG. 1E, the support is removed from the light emitting devices.

For example, light emitting devices, each including one light emitting element 1 with its lateral surfaces 13 covered with the resin member of the predetermined thickness, can be manufactured in the above-described manner.

This cutting step is performed as needed. For example, by cutting the resin member 30 so as to include one light emitting element 1, the light emitting device having one light emitting element 1 can be obtained. Alternatively, by cutting the resin member 30 so as to include a plurality of light emitting elements 1, the light emitting device having the plurality of light emitting elements 1 can be obtained. In the case of including a plurality of light emitting elements 1, a linear light emitting device can be obtained in which the light emitting elements 1 are arranged in a line. Alternatively, a planar light emitting device can be obtained in which the light emitting elements 1 are arranged in a matrix.

According to the method of manufacturing a light emitting device of the first embodiment described above, the viscosity of the resin layer is reduced by heating the resin layer at the first temperature lower than the second temperature, which is the curing temperature for curing the resin layer, thereby causing the light emitting element to sink due to its own weight such that the second surface 12 of the semiconductor laminate is exposed from the resin layer. This makes it possible to manufacture the light emitting device in which the surfaces of the laminate structure of the light emitting element except for one surface thereof are covered with the resin layer merely by changing the temperature of the resin layer without using any special equipment such as a weighting device, for example. Consequently, the light emitting device can be manufactured at low cost.

Various modifications can be made to the method of manufacturing a light emitting device according to the first embodiment as follows, so that a wide variety of light emitting devices can be manufactured.

Modification 1

A method of manufacturing a light emitting device of a modification 1 is a method of manufacturing a light emitting device that includes the light emitting element 1 and a resin member 30 containing a phosphor that converts the wavelength of light from the light emitting element 1.

Specifically, in the method of manufacturing a light emitting device according to the modification 1 of the first embodiment, a resin containing particles of the phosphor is used for a resin layer 31. The light emitting element 1 is caused to sink in the resin layer 31 containing the particles of the phosphor, followed by curing the resin layer 31, which allows for manufacturing the light emitting device in which the surfaces of the semiconductor laminate except for the second surface 12 are covered with the wavelength conversion member.

It is noted that the specific gravity and/or viscosity of the resin layer 31 containing the particles of the phosphor and the like varies depending on the particle size, particle size distribution, content, etc., of the particles of the phosphor contained in the resin. Therefore, the A-stage state only needs to be set as appropriate in consideration of these factors.

Examples of the phosphor suitable for use here include yttrium aluminum garnet-based phosphors (e.g., $Y_3(Al,Ga)_5O_{12}$:Ce), lutetium aluminum garnet-based phosphors (e.g., $Lu_3(Al,Ga)_5O_{12}$:Ce), terbium aluminum garnet-based phosphors (e.g., $Tb_3(Al,Ga)_5O_{12}$:Ce), CCA-based phosphors (e.g., $Ca_{10}(PO_4)_6Cl_2$:Eu), SAE-based phosphors (e.g., $Sr_4Al_{14}O_{25}$:Eu), chlorosilicate-based phosphors (e.g., $Ca_8MgSi_4O_{16}Cl_2$:Eu), β-SiAlON-based phosphors (e.g., $(Si,Al)_3(O,N)_4$:Eu), α-SiAlON-based phosphors (e.g., $Mz(Si,Al)_{12}(O,N)_{16}$:Eu (where 0<z≤2 and M is any one of Li, Mg, Ca, Y, and lanthanide elements except La and Ce)), nitride-based phosphors such as SLA-based phosphors (e.g., $SrLiAl_3N_4$:Eu), CASN-based phosphors (e.g., $CaAlSiN_3$:Eu) or SCASN-based phosphors (e.g., $(Sr,Ca)AlSiN_3$:Eu), fluoride-based phosphors such as KSF-based phosphors (e.g., $K_2(Si,Al)F_6$:Mn), KSAF-based phosphors (e.g., $K_2Si_{0.99}Al_{0.01}F_{5.99}$:Mn) or MGF-based phosphors (e.g., $3.5MgO·0.5MgF_2·GeO_2$:Mn), phosphors with a perovskite structure (e.g., $CsPb(F,Cl,Br,I)_3$), and quantum dot phosphors (e.g., CdSe, InP, $AgInS_2$, or $AgInSe_2$). One type of phosphor or a plurality of types of phosphors may be used as the phosphor to be added to the resin member 30.

The KSAF-based phosphor may have a composition represented by the following formula (I).

$$M_2[Si_pAl_qMn_rF_s] \tag{I}$$

In the formula (I), M represents an alkali metal, which may contain at least K. Mn can be a tetravalent Mn ion. Here, p, q, r, and s may satisfy the followings: $0.9 \leq p+q+r \leq 1.1$, $0<q \leq 0.1$, $0<r \leq 0.2$, and $5.9 \leq s \leq 6.1$. They may preferably satisfy the followings: $0.95 \leq p+q+r \leq 1.05$ or $0.97 \leq p+q+r \leq 1.03$; $0<q \leq 0.03$, $0.002 \leq q \leq 0.02$ or $0.003 \leq q \leq 0.015$; $0.005 \leq r \leq 0.15$, $0.01 \leq r \leq 0.12$ or $0.015 \leq r \leq 0.1$; and $5.92 \leq s \leq 6.05$ or $5.95 \leq s \leq 6.025$. The KSAF-based phosphor may have any one of the compositions given below: $K_2[Si_{0.946}Al_{0.005}Mn_{0.049}F_{5.995}]$, $K_2[Si_{0.942}Al_{0.008}Mn_{0.050}F_{5.992}]$, and $K_2[Si_{0.939}Al_{0.014}Mn_{0.047}F_{5.986}]$. Such a KSAF-based phosphor can provide red light emission with high brightness and a narrow half maximum full-width of the emission peak wavelength.

Modification 2

A method of manufacturing a light emitting device of a modification 2 is a method of manufacturing a light emitting device that includes the light emitting element 1 and a resin member 30 containing a light diffusing agent that reflects the light from the light emitting element 1.

Specifically, in the method of manufacturing a light emitting device according to the modification 2 of the first embodiment, a resin containing particles of the light diffusing agent made of, for example, titanium oxide, silicon oxide, aluminum oxide, or zinc oxide is used as the resin layer 31. The light emitting element 1 is caused to sink in the resin layer 31 containing the particles of the light diffusing agent, followed by curing the resin layer 31, which can manufacture the light emitting device in which a light reflective layer is provided on the surfaces of the semiconductor laminate except for the second surface 12, for example.

The light emitting device manufactured by the manufacturing method of the modification 2 described above can be applied to the manufacture of, for example, a light emitting device that emits light from the second surface 12 side where the electrodes are disposed.

In the manufacturing method of the modification 2, a light emitting device having substantially no resin member 30 disposed on the first surface 11 of the light emitting element 1 can be manufactured by removing a portion of the resin member 30 disposed on the first surface 11 of the light emitting element 1, or by curing the resin layer 31 in the state in which the light emitting element 1 has sunk in the resin layer 31 such that the first surface 11 of the light emitting element 1 contacts with the support 35. The light emitting device manufactured in this way enables the light emitted from the lateral surface of the light emitting element 1 to reflect and exit from the first surface 11 of the light emitting element 1. It is noted that the specific gravity and/or viscosity of the resin layer 31 containing the particles of the light diffusing agent and the like varies depending on the particle size, particle size distribution, content, etc., of the particles of the light diffusing agent contained in the resin. Therefore, the A-stage state only needs to be set as appropriate in consideration of these factors.

Modification 3

A method of manufacturing a light emitting device of a modification 3 is a method of manufacturing a light emitting device comprising the light emitting element 1, a light reflective layer (hereinafter referred to a first light reflective layer) provided over the first surface 11 of the light emitting element 1, and a light-transmissive resin member 30 provided to cover the lateral surfaces 13 of the light emitting element 1.

Specifically, in the method of manufacturing a light emitting device of the first embodiment, a cured first light reflective layer 25 is disposed on the upper surface of the support 35, and the resin layer 31 is disposed on the first light reflective layer 25, as shown in FIG. 1F. The first light reflective layer 25 can be prepared by forming or purchasing a pre-cured light reflective layer and then disposed on the support. Alternatively, the first light reflective layer 25 can be prepared by disposing a liquid light reflective member on the support and then curing it through heating or the like.

Subsequently, as shown in FIG. 1G, the resin layer 31 is cured while the light emitting elements 1 are caused to sink in the resin layer 31, and then the light emitting elements 1 are singulated along with the resin layer 31 in a state in which the first light reflective layer 25 remains over the first surface 11 of each of the light emitting elements 1.

This can manufacture a light emitting device with so-called batwing light distribution, which efficiently emits light from the lateral surfaces 13 of the light emitting element 1 while reducing the light emitted above the first surface 11 of the light emitting element 1.

The resin member 30 having the wavelength conversion function by containing a phosphor in the resin layer 31 may be used in the method of manufacturing the modification 3.

The method of manufacturing a light emitting device of the modification 3 makes it possible to change the distance between the first light reflective layer 25 and the first surface 11 of the light emitting element 1 by varying the thickness of the resin layer 31 or by adjusting the position of the light emitting element 1 that sinks in the resin layer 31 through the adjustment of the viscosity of the resin layer 31 or the like.

This can allow for manufacturing of light emitting devices with different batwing light distribution characteristics.

Modification 4

A manufacturing method of a modification 4 comprises disposing a light reflective layer 24 (hereinafter referred to as a second light reflective layer) covering the second surface 12 and the lateral surfaces of the electrode 20 as shown in FIG. 1H, after forming the resin member 30 in the method of manufacturing a light emitting device according to the first embodiment or the modifications 1 to 3. The step of disposing the second light reflective layer 24 involves disposing the second light reflective layer 24 on the upper surface of the resin member 30 and the second surfaces 12 of the light emitting elements 1 by using, for example, roll coating, spraying, compression molding, etc., as shown in FIG. 1H. At this time, the second light reflective layer 24 is disposed to cover the lateral surfaces of the electrode 20 and also to expose the upper surface of the electrode 20. Alternatively, after disposing the second light reflective layer 24 to cover the lateral surfaces and upper surface of the electrode 20 and then grinding portions of the second light reflective layer 24 from its upper surface, the corresponding portions of the electrode 20 and the second light reflective layer 24 may be removed to expose the surface of the electrode 20 from the second light reflective layer 24. The surface of the electrode 20 exposed from the second light reflective layer 24 becomes a new upper surface of the electrode 20.

The light emitting device manufactured by the manufacturing method of the modification 4 described above comprises the second light reflective layer 24 covering the second surface 12 and the lateral surfaces of the electrode 20, thereby enabling the light traveling to the second surface 12 side to be reflected and exit from the first surface 11, which allows the emitted light to efficiently exit from the light emitting device.

Modification 5

A manufacturing method of a modification 5 comprises disposing the second light reflective layer of the modification 4, which covers the second surface 12 and the lateral surface of the electrode 20, in the manufacturing method of the modification 3.

As shown in FIG. 1I, a light emitting device 100A manufactured by the manufacturing method of the modification 5 described above comprises: the first light reflective layer 25 provided above the light emitting element 1; the light-transmissive resin member 30 provided to cover the light emitting surface and lateral surfaces of the light emitting element 1; and the second light reflective layer 24 covering the lateral surfaces of electrodes 21 and 22 of the light emitting element 1 and the surface of the light emitting element 1 on which the electrodes 21 and 22 are formed.

In the light emitting device 100A, the light reflective layers 24 and 25 can be formed of, for example, a resin that contains titanium oxide, silicon oxide, aluminum oxide, zinc oxide, or the like as a light diffusing agent. For example, a silicone resin, an epoxy resin, an acrylic resin, or the like can be used as such a resin material. The light reflective layers 24 and 25 may be a metal layer made of, for example, platinum, silver, rhodium, aluminum, etc., or a Distributed Bragg Reflector (DBR). The light reflective layers 24 and 25 may be inorganic members.

A distance d1 from the lateral surface of the light emitting element 1 to the outer lateral surface of the resin member 30 is preferably longer than a distance d2 from the upper surface of the light emitting element 1 to the upper surface of the resin member 30. Thus, the light emitted from the lateral surfaces of the light emitting element 1 is more likely to propagate to the lateral surfaces of the resin member 30 than to the upper surface of the resin member 30, which can increase the proportion of light taken out from the sides of the light emitting device 100A. The distance d1 from the lateral surface of the light emitting element 1 to the lateral surface of the resin member 30 is preferably about 1.5 to 2.5 times (inclusive) the distance d2 from the upper surface of the light emitting element 1 to the upper surface of the resin member 30, and more preferably the distance d1 is about twice the distance d2.

The light emitting device 100A can also be caused to emit white light by disposing a sheet-shaped wavelength conversion member containing the phosphor described above (hereinafter referred to as a wavelength conversion sheet) on its top. For example, white light can be obtained by combining the light emitting device of the present disclosure capable of emitting blue light and a wavelength conversion sheet containing a phosphor capable of emitting yellow light. Another option may be to combine the light emitting device capable of emitting blue light and a wavelength conversion sheet that contains a phosphor capable of emitting red light (hereinafter referred to as a red phosphor) and a phosphor capable of emitting green light (hereinafter referred to as green phosphors). Alternatively, the light emitting device capable of emitting blue light may be combined with a plurality of wavelength conversion sheets. As a plurality of wavelength conversion sheets, for example, a wavelength conversion sheet containing a red phosphor and a wavelength conversion sheet containing a green phosphor can be selected. Alternatively, a light emitting device comprising the light emitting element capable of emitting blue light and a light-transmissive member containing a red phosphor, and a wavelength conversion sheet containing a green phosphor may be combined.

Second Embodiment

A method of manufacturing a light emitting device according to a second embodiment of the present disclosure is a method of manufacturing a light emitting device 200 comprising the light emitting device 100 wherein the resin member 30 contains a phosphor (hereinafter referred to as a first phosphor), manufactured by the manufacturing method according to the modification 1 of the first embodiment, and further comprising a resin member 130 containing a second phosphor different from the first phosphor on the resin member 30 of the light emitting device 100.

First, the light emitting device 100 wherein the resin member 30 contains the first phosphor is prepared by the manufacturing method according to the modification 1 of the first embodiment.

In parallel with the preparation of the light emitting device 100, the resin in an uncured state that contains the second phosphor is disposed on the support 35, and thereby a resin layer 131 in the A-stage state is disposed as shown in FIG. 2A in the same manner as in the step (a) of disposing the resin layer 31 of the first embodiment. The viscosity and the like of the resin layer 131 in the uncured state is adjusted such that the light emitting element 100 sinks due to its own weight to expose the second surface 12 of the semiconductor laminate 10, based on the specific gravity of the resin layer 131 and the own weight of the light emitting device 100. A resin similar to that used in the first embodiment can be used as the resin contained in the resin layer 131.

Preferably, the same resin as that constituting the resin layer 31 in the first embodiment is used.

Then, in a state in which the resin layer 131 disposed on the support 35 remains in the A-stage state, the light emitting device 100 is placed while the upper surface of the resin layer 131 and the light emitting surface of the light emitting device 100 face each other as shown in FIG. 2B, in the same manner as the step (b) of placing the light emitting element 1 of the first embodiment. The light emitting device 100 is disposed at predetermined intervals, for example, in a matrix, in consideration of the thickness of the resin member 130 covering the lateral surfaces of the light emitting device 100 in the targeted light emitting device 200.

Then, the viscosity of the resin layer 131 is lowered by heating the resin layer 131 at the first temperature, causing the light emitting device 100 to sink due to their own weight such that an electrode formation surface of the light emitting device 100 is exposed as shown in FIG. 2C, in the same manner as the step (c) of causing the light emitting element 1 to sink in the first embodiment.

In the subsequent step, the resin layer 131 is cured by being heated at the second temperature higher than the first temperature to form the resin member 130, in the same manner as the step (d) of curing the resin layer 31 to form the resin member 30 in the first embodiment. Then, portions of the resin member 130 are cut between adjacent light emitting devices 100 such that a portion of the resin member 130 with a predetermined thickness covers each lateral surface of the corresponding light emitting device 100 as shown in FIG. 2D. FIG. 2E shows the cross-section of the light emitting devices 200 obtained after removing each support.

According to the method of manufacturing a light emitting device of the second embodiment described above, the light emitting device 200 comprising the light emitting element 1, the resin member 30 covering the light emitting element 1 except for the second surface 12 thereof, and the second resin member 130 covering the resin member 30 can be manufactured at low cost without using special equipment related to weighting or the like.

In the light emitting devices of the first and second embodiments described above, the light emitting element 1 or the light emitting device 100 is exemplified to sink in the resin layer 31 or 131 such that the surface of the resin layer 31 or 131 between adjacent light emitting elements 1 or between adjacent light emitting devices 100 becomes substantially flat in the step (c) of causing the light emitting element 1 or light emitting device 100 to sink. However, the method of manufacturing a light emitting device according to the present disclosure is not limited thereto.

For example, as shown in FIG. 3A, the light emitting element 1 or light emitting device 100 may sink in the resin layer 31 or 131 such that the surface of the resin layer 31 or 131 between adjacent light emitting elements 1 or light emitting devices 100 is recessed to form a curved surface.

To cause the light emitting element 1 or light emitting device 100 to sink in the resin layer 31 or 131 in such a state, the viscosity of the resin layer 31 or 131 in the A-stage state, the first temperature for heating, and the wettability of the resin layer 31 or 131 to the lateral surface of the light emitting element 1 or light emitting device 100 may be adjusted as appropriate. FIG. 3B shows the cross-section of the light emitting devices obtained by curing the resin layer 31 from the state shown in FIG. 3A, cutting portions of the resin member 30, and then removing the support 35.

The light emitting device shown in FIG. 3B may also have a light reflective layer (corresponding to the second light reflective layer 24 shown in FIG. 1I) that covers the second surface of the light emitting element and the lateral surfaces of the electrodes and further covers the inclined surface of the resin member 30 continuously from the second surface of the light emitting element. With the above-described arrangement, when the resin layer 31 is formed of a light-transmissive resin, the light is reflected on the inclined surface of the resin member 30 covered with the light reflective layer and thus can be taken out to the outside. To manufacture such a light emitting device, the singulation may be performed after disposing and curing the light reflective layer covering the second surface of the light emitting element and the lateral surfaces of the electrodes as well as the recessed surface of the resin layer 31 at the stage prior to the singulation shown in FIG. 3A.

As shown in FIG. 4A, the light emitting element 1 or light emitting device 100 may be caused to sink in the resin layer 31 or 131 such that the resin layer 31 or 131 intermediate portion or partially covers the lateral surfaces of the light emitting element 1 or light emitting device 100.

To cause the light emitting element 1 or light emitting device 100 to sink in the resin layer in such a state, the weight of the light emitting element 1 or light emitting device 100, the viscosity of the resin layer 31 or 131, the first temperature for heating, and the wettability of the resin layer 31 or 131 to the lateral surface of the light emitting element 1 or light emitting device 100 may be adjusted as appropriate.

FIG. 4B shows the cross-section of the light emitting devices obtained by curing the resin layer 31 from the state shown in FIG. 4A, cutting portions of the resin member 30, and then removing the support 35.

Third Embodiment

A method of manufacturing a light emitting device according to a third embodiment of the present disclosure differs from that of the first embodiment in that the method comprises preparing a resin layer 31 with recesses 33. In the third embodiment, the recess 33 comprises a bottom surface 33a on which the light emitting element 1 is to be placed and a lateral surface 33b that faces the lateral surface 13 of the placed light emitting element 1 with a predetermined spacing between them. In the step of placing the light emitting element, the light emitting element 1 is placed on the bottom surface 33a.

The method of manufacturing a light emitting device of the third embodiment is configured in the same manner as that of the first embodiment except for the above-described points. In the following, a detailed description will be given on the method of manufacturing a light emitting device of the third embodiment, focusing on the differences from that of the first embodiment.

(a) Step of Preparing Resin Layer 31 with Recesses 33

The step of preparing the resin layer 31 with the recesses 33 may be performed by purchasing a resin layer 31 with recesses 33. Alternatively, the resin layer 31 may be prepared by forming the recesses 33 therein by the following steps (a1) and (a2).

(a1) Step of Disposing Resin Layer 31

Here, the resin layer 31 in the A-stage state is disposed as shown in FIG. 5A by attaching a resin sheet in the A-stage state, which has been prepared in advance, onto the support 35. The attachment of the resin sheet can be performed, for example, by the vacuum laminator. For example, the resin layer 31 in the A-stage state may be disposed by applying a resin in an uncured state onto the support 35. Here, the A-stage state means the uncured state described in the first embodiment.

(a2) Step of Forming Recesses 33 in Upper Surface of Resin Layer 31

Here, after disposing the resin layer 31 on the support 35 and before placing the light emitting element 1 thereon, recesses are formed in the upper surface of the resin layer 31 at the position where the light emitting element 1 is to be placed. For example, die 50 is pressed from the upper surface of the resin layer 31 in the A-stage state to a predetermined depth as shown in FIGS. 5B and 5C, and then the die 50 is removed from the resin layer 31, whereby the recess 33 is formed in the resin layer 31 as shown in FIG. 5D.

The recess 33 may be formed by a die configured by integrating a plurality of dies 50. Alternatively, the recess 33 may be formed by pushing the die 50 adsorbed onto the tip of a collet of a die bonding device to a predetermined depth at a predetermined position (where each light emitting element is to be placed) while moving the die 50 sequentially.

The shape of the recess 33 is set such that the light emitting element 1 is brought into a desired sinking state when the resin layer 31 is at the first temperature, depending on the type of resin material forming the resin layer 31 and its viscosity in the A-stage state as well as the shape and weight of the light emitting element. That is, the sinking state of the light emitting element 1 when the resin layer 31 is set at the first temperature with the light emitting element 1 placed on the bottom surface of the recess 33 of the resin layer 31 changes depending on the shape of the recess 33, the interval between the adjacent recesses 33, and the like, in addition to the type of resin material forming the resin layer 31, its viscosity in the A-stage state, and the shape and weight of the light emitting element 1. The sinking state of the light emitting element 1 may depend on the shape of the recess 33 and the interval between the adjacent recesses 33 even on the same conditions about the resin material for forming the resin layer, the viscosity of the resin material in the A-stage state, and the first temperature of the resin layer. In the sinking state of the light emitting element 1, for example, the upper surface of the resin layer between the light-emitting elements placed adjacent to each other is brought into a state of being located substantially on the same plane as the electrode formation surface of the light emitting element (hereinafter referred to as state 1). In another sinking state of the light emitting element 1, for example, the upper surface of the resin layer between the adjacent light emitting elements is brought into a state of being located below the plane including the electrode formation surface of the light emitting element (hereinafter referred to as state 2). In a further sinking state of the light emitting element 1, for example, the upper surface of the resin layer between the adjacent light emitting elements is brought into a state of being located above the plane including the electrode formation surface of the light emitting element (hereinafter referred to as state 3). Specific setting methods of the recess will be described later because they relate to the first temperature or the like.

(b) Step of Placing Light Emitting Element 1

Here, while the resin layer 31 remains in the A-stage state, each light emitting element 1 is placed on the bottom surface 33a of the recess 33 as shown in FIG. 5E. The light emitting element 1 is preferably placed, for example, such that its center axis (the center axis perpendicular to its bottom surface) is coincident with the center axis of the recess 33 (the center axis perpendicular to the bottom surface 33a). Here, the term "coincident" means the deviation between these center axes is within the allowable range of misalignment of the light emitting element 1.

A method of placing each light emitting element 1 on the bottom surface 33a of the recess 33 is not particularly limited, and the light emitting elements 1 may be placed one by one in sequence, or a plurality of light emitting elements 1 may be placed collectively. For example, in the case of placing a plurality of light emitting elements 1 collectively, the light emitting elements are prepared in such a manner that they are disposed via a photosensitive adhesive on a support (hereinafter referred to as a second support) which is different from the support on which the above-described resin layer 31 is disposed. Then, the adhesive is irradiated with laser light from the second support side, and thereby the plurality of light emitting elements are peeled off from the second support. Thus, the light emitting elements 1 can be collectively transferred and placed onto the respective bottom surfaces 33a of the recesses 33.

(c) Step of Causing Light Emitting Element 1 to Sink

Here, as shown in FIG. 5F, the resin layer 31 is heated at the first temperature to reduce the viscosity of the resin layer 31, causing the light emitting elements 1 to sink in the resin layer 31 such that the softened resin on the lateral walls surrounding the recess 33 covers the lateral surfaces of the semiconductor laminate 10 with the second surface 12 of each semiconductor laminate 10 exposed from the upper surface of the resin layer 31.

(D) Step of Forming Resin Member 30 by Curing Resin Layer 31

Here, the resin layer 31 is cured, with the second surface 12 exposed, by heating the resin layer 31 at the second temperature higher than the first temperature. In this way, the resin member 30 is formed.

Next, the resin member is cut between adjacent light emitting elements 1 in the same manner as the first embodiment, and then the light emitting devices are separated from the support.

Setting of First Temperature and Shape of Recess

The first temperature and the shape of the recess 33 are set to achieve the desired state such as the state 1, 2, or 3 in consideration of the type of resin material forming the resin layer 31 and its viscosity in the A-stage state as well as the shape and weight of the light emitting element. For example, the shape of the recess 33 can be set with reference to a database that stores data about the viscosity of the resin material in the A-stage state, the first temperature, the shape of the recess 33, and the interval between the adjacent recesses 33. The data are respectively optimized to achieve the desired state such as the state 1, 2, or 3, in consideration of the type of the resin material forming the resin layer 31 and the shape and weight of the light emitting element. This database stores parameters such as the viscosity of the resin material in the A-stage state, the first temperature, the shape of the recess 33, the interval between the adjacent recesses 33, and the like, which are optimized to achieve any one of the states 1 to 3 for each resin material with regard to the light emitting element to be used, for example. Each parameter can be determined by an experiment or the like. The database preferably stores the parameters optimized for each combination of resin materials and light emitting elements which are to be used, for example. This enables the selection of one of the combinations of the resin materials and the light emitting elements and further enables the selection of one of the states 1 to 3 depending on the purpose.

It is also confirmed that the method of manufacturing a light emitting device of the third embodiment can maintain the positional accuracy in placing the light emitting element 1 on the bottom surface of the recess 33, depending on the shape of the recess 33, even after the resin layer 31 is cured with the light emitting element 1 sinking therein.

Maintaining this positional accuracy depends mainly on the width W1 and height H1 of the light emitting element 1, the depth D33 and width W33 of the recess 33, and the width W50 of the wall between adjacent recesses 33, as shown in FIG. 6. In other words, to maintain this positional accuracy, the depth D33 and width W33 of the recess 33 and the width W50 of the wall between adjacent recesses 33 are set as appropriate in consideration of the width W1 and height H1 of the light emitting element 1 and the depth D33 and width W33 of the recess 33. However, to effectively obtain the effect of maintaining the positional accuracy, it is preferable that the depth D33 of the recess 33 is larger than the height H1 of the light emitting element 1. The recess 33 is formed to have a depth of, for example, 100 μm to 200 μm. The depth of the recess 33 is preferably larger than the thickness of the light emitting element in order to maintain the positional accuracy in disposing the light emitting element. For example, when the light emitting element having a thickness of 150 μm is disposed, the recess 33 is formed to have a depth of more than 150 μm. Here, the thickness of the light emitting element means the thickness of a portion of the light emitting element excluding the electrodes.

As described above, by adjusting the shape of the recess 33 and the interval between the recesses 33 in the method of manufacturing a light emitting device of the third embodiment, the positional accuracy of the light emitting element when it is placed can be maintained even after the resin layer is cured.

Therefore, the first temperature and the shape of the recess are preferably set to achieve the desired state such as the state 1, 2, or 3 and also to obtain the effect of suppressing the misalignment in consideration of the type of resin forming the resin layer 31 and the shape and weight of the light emitting element.

That is, the shape of the recess 33 can be preferably set with reference to a database that stores data about the A-stage state of the resin, the first temperature, the shape of the recess 33, and the interval between the adjacent recesses 33. The data are respectively optimized to achieve the desired state such as the state 1, 2, or 3 and also to obtain the effect of suppressing the misalignment, in consideration of the type of the resin material forming the resin layer 31 and the shape and weight of the light emitting element. It is obvious that the database preferably stores the parameters optimized for each combination of resin materials and light emitting elements, which are to be used, for example.

According to the method of manufacturing a light emitting device of the third embodiment as above-described, the positional accuracy of the light emitting element can be enhanced, and the light emitting device with the desired structure can be manufactured easily.

Fourth Embodiment

A manufacturing method according to a fourth embodiment of the present disclosure is a method of manufacturing a light emitting module, for example, in which a plurality of light sources are disposed in a matrix on a light guide plate. Hereinafter, the manufacturing method will be described with references to FIGS. 7A to 7C. In the description below, this manufacturing method will be described specifically by an example in which the plurality of light emitting devices 100 manufactured by the manufacturing method of the first embodiment are used as the light sources. However, the manufacturing method of the fourth embodiment is not limited to this. For example, the light emitting element 1 shown in the first embodiment may be used as the light source. Additionally or alternatively, the light emitting device manufactured by the manufacturing method of the second or third embodiment can also be used as the light source.

First, a light guide plate 310 is prepared in the manufacturing method of the fourth embodiment. The light guide plate 310 is a member that spreads the light emitted from the light emitting device as the light source, over its surface, and is a substantially plate-shaped member that includes a second main surface 312 serving as a light extraction surface and a first main surface 311 located on the opposite side to the second main surface 312. First recess 313 is formed in the first main surface 311. The first recess 313 is a part where the light emitting device 100 is disposed. The second main surface 312 of the light guide plate 310 may have a second recess 315 disposed at the position corresponding to the recess 313 on the first main surface 311. The light guide plate 310 shown in FIG. 7A has two first recesses 313 by way of example. For example, the first recesses 313 can be disposed in the first main surface 311 in a matrix.

Such a light guide plate 310 can be prepared by, for example, injection molding, transfer molding, thermal transfer, or the like. Examples of the material usable for the light guide plate 310 include thermoplastic resins such as an acrylic resin, polycarbonate, cyclic polyolefin, polyethylene terephthalate, and polyester, thermosetting resins such as an epoxy resin and a silicone resin, or glass. The first recess 313 and the second recess 315 of the light guide plate 310 can be formed collectively when forming the light guide plate 310. This can reduce the misalignment in the formation of the recesses. The light guide plate 310 may be prepared by first preparing a light-transmissive plate without the first recess 313 or second recess 315 through purchasing or molding and then forming the first recess 313 and the second recess 315. Alternatively, the light guide plate 310 having the first recess 313 and the second recess 315 may be prepared by purchasing.

The second recess 315 can be a cone-shaped recess, such as a conical-shaped or pyramidal-shaped recess, or a truncated cone-shaped or pyramidal-shaped recess. The second recess 315 can reflect the light from the light emitting device 100 toward its lateral sides. A light reflective member may be disposed inside the second recess 315. The light reflective member can be formed using, for example, a thin film or the like made of a resin material containing a light diffusing agent such as titanium oxide, an insulating inorganic material such as oxides or nitrides, or a conductive material such as metal.

Next, as shown in FIG. 7A, uncured resin is injected into each of the first recesses 313 in the prepared light guide plate 310, thereby providing resin-supplied portions 331 supplied with the resin in the A-stage state.

Then, as shown in FIG. 7B, each light emitting device 100 is placed on the resin-supplied portion 331 with the injected resin therein remaining in the A-stage state such that the light emitting surface of the light emitting element faces the corresponding resin-supplied portion 331. As used herein, the expression "the light emitting surface of the light emitting element faces the resin-supplied portion 331" may include a case in which the light emitting surface of the light emitting element faces the resin-supplied portion 331 via a resin member as shown in FIG. 7B.

Then, as shown in FIG. 7C, the resin-supplied portion 331 is heated at the first temperature to reduce the viscosity of the resin of the resin-supplied portion 331, causing the light emitting devices 100 to sink due to their own weight in such a manner as to expose the electrode formation surface of each light emitting device 100. Subsequently, the resin-supplied portion 331 is heated at the second temperature higher than the first temperature to cure the resin-supplied portion 331 with the second surface 12 exposed. Consequently, a resin member 330 is disposed within the first recess 313 so as to cover the surfaces of the light emitting device 100 except for the electrode formation surface.

The method of manufacturing the fourth embodiment described above makes it possible to manufacture the light emitting module comprising the plurality of light emitting devices 100 on the light guide plate 310 at low cost.

While the method of manufacturing the light emitting module of the fourth embodiment described above has been described by an example in which the first recesses 313 are provided in the light guide plate 310, instead of the first recess 313, a through hole penetrating from the upper surface to the lower surface of the light guide plate 310 may be used. In this case, for example, the resin-supplied portion is disposed with the through hole covered on its lower surface side, and consequently the light emitting module can be manufactured in the same manner as in the case of the light emitting module with the first recess 313.

DESCRIPTION OF REFERENCE NUMERALS

1 Light emitting element
10 Semiconductor laminate

11 First surface
12 Second surface
13 Lateral surface
20 Electrode
21 First electrode
22 Second electrode
24 Light reflective layer (second light reflective layer)
25 Light reflective layer (first light reflective layer)
30, 130 Resin member
31, 131 Resin layer
35 Support
100, 200 Light emitting device
310 Light guide plate
311 Upper surface
312 Lower surface
313 First recess
315 Second recess
330 Resin member
331 Resin-supplied portion

What is claimed is:

1. A method of manufacturing a light emitting device, the method comprising:
    providing a light emitting element comprising:
        a semiconductor laminate having a first surface, a second surface opposite to the first surface, and a lateral surface between the first surface and the second surface, and
        an electrode disposed at the second surface of the semiconductor laminate;
    disposing a resin layer in an A-stage state on a support;
    placing the light emitting element on an upper surface of the resin layer while the upper surface of the resin layer and the first surface of the semiconductor laminate face each other;
    heating the resin layer at a first temperature to reduce a viscosity of the resin layer and causing the light emitting element to sink due to its own weight such that the second surface of the semiconductor laminate is exposed; and
    curing the resin layer, with the second surface exposed, by heating the resin layer at a second temperature higher than the first temperature, thereby forming a resin member that covers at least the lateral surface of the light emitting element.

2. The method of manufacturing a light emitting device according to claim 1, further comprising:
    after the step of disposing the resin layer and before the step of placing the light emitting element, forming a recess in the upper surface of the resin layer at a position where the light emitting element is to be placed, wherein the recess has a bottom surface where the light emitting element is to be placed and a lateral surface that faces a lateral surface of the light emitting element with a predetermined spacing between the lateral surface of the recess and the lateral surface of the light emitting element,
    wherein in the step of placing the light emitting element, the light emitting element is placed on the bottom surface.

3. The method of manufacturing a light emitting device according to claim 1, further comprising:
    before the step of disposing the resin layer, providing the resin layer in the A-stage state in which a recess is in the upper surface of the resin layer at a position where the light emitting element is to be placed, wherein the recess has a bottom surface, and a lateral surface that faces a lateral surface of the light emitting element with a predetermined spacing between the lateral surface of the recess and the lateral surface of the light emitting element,
    wherein, in the step of disposing the resin layer, the resin layer in the A-stage state with the recess is disposed on the support, and
    in the step of placing the light emitting element, the light emitting element is placed on the bottom surface.

4. The method of manufacturing a light emitting device according to claim 1, wherein the resin layer contains a phosphor.

5. The method of manufacturing a light emitting device according to claim 1, wherein a thickness of the resin layer is greater than a thickness of the semiconductor laminate.

6. The method of manufacturing a light emitting device according to claim 1, further comprising:
    before the step of disposing the resin layer, disposing a light reflective layer on the support,
    wherein, in the step of disposing the resin layer, the resin layer is disposed on the light reflective layer.

7. The method of manufacturing a light emitting device according to claim 6, wherein, in the step of disposing the light reflective layer, the light reflective layer is pre-cured when disposed on the support.

8. The method of manufacturing a light emitting device according to claim 6, wherein, the step of disposing the light reflective layer comprises disposing a liquid light reflective member on the support, and subsequently curing the light reflective member.

9. The method of manufacturing a light emitting device according to claim 1, further comprising, after the step of curing the resin layer, forming a light reflective layer covering the second surface of the semiconductor laminate and a lateral surface of the electrode.

10. The method of manufacturing a light emitting device according to claim 1, wherein, in the step of curing the resin layer, the resin member is formed so as to cover the first surface of the light emitting element.

11. A method of manufacturing a light emitting module, the method comprising:
    providing a light source comprising:
        a semiconductor laminate having a first surface, a second surface opposite to the first surface, and a lateral surface between the first surface and the second surface, and
        an electrode disposed at the second surface of the semiconductor laminate,
        wherein the lateral surface of the semiconductor laminate is covered with a first resin member and at least the second surface of the semiconductor laminate is exposed to an outside;
    providing a light guide plate having a first main surface and a second main surface opposite to the first main surface, and having a recess in the first main surface;
    disposing a resin layer in an A-stage state inside the recess;
    placing the light source on an upper surface of the resin layer while the first surface of the light emitting element faces toward the upper surface of the resin layer;
    heating the resin layer at a first temperature to reduce a viscosity of the resin layer and causing the light source to sink due to its own weight such that the second surface of the semiconductor laminate is exposed; and
    curing the resin layer, with the second surface exposed, by heating the resin layer at a second temperature higher than the first temperature, thereby forming a second resin member that covers at least a lateral surface of the light source.

12. The method of manufacturing a light emitting module according to claim 11, wherein, the step of providing the light source comprises:
- providing a light emitting element comprising:
  - a semiconductor laminate having a first surface, a second surface opposite to the first surface, and a lateral surface between the first surface and the second surface, and
  - an electrode disposed at the second surface of the semiconductor laminate;
- disposing a resin layer in an A-stage state on a support;
- placing the light emitting element on an upper surface of the resin layer while the upper surface of the resin layer and the first surface of the semiconductor laminate face each other;
- heating the resin layer at a first temperature to reduce a viscosity of the resin layer and causing the light emitting element to sink due to its own weight such that the second surface of the semiconductor laminate is exposed; and
- curing the resin layer, with the second surface exposed, by heating the resin layer at a second temperature higher than the first temperature, thereby forming a resin member that covers at least the lateral surface of the light emitting element.

* * * * *